United States Patent
Wilcox

(10) Patent No.: US 6,738,442 B1
(45) Date of Patent: May 18, 2004

(54) PULSE DETECTION AND SYNCHRONIZATION SYSTEM

(75) Inventor: Eric Wilcox, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/487,853

(22) Filed: Jan. 19, 2000

(51) Int. Cl.[7] .............................................. H04L 7/02
(52) U.S. Cl. ...................... 375/360; 327/142; 327/166
(58) Field of Search ................................ 375/354, 360, 375/370; 327/141, 142, 160, 164, 165, 166; 370/503

(56) References Cited

U.S. PATENT DOCUMENTS

| | | | |
|---|---|---|---|
| 4,412,342 A | | 10/1983 | Khan et al. ................ 375/107 |
| 4,899,351 A | * | 2/1990 | Bonke ...................... 375/357 |
| 4,973,860 A | * | 11/1990 | Ludwig ..................... 327/145 |
| 5,155,745 A | * | 10/1992 | Sugawara et al. .......... 375/360 |
| 5,331,669 A | * | 7/1994 | Wang et al. ............... 375/371 |
| 5,959,915 A | * | 9/1999 | Kwon et al. ............... 365/201 |
| 6,393,081 B1 | * | 5/2002 | Whetsel .................... 375/354 |

* cited by examiner

*Primary Examiner*—Stephen Chin
*Assistant Examiner*—Dac V. Ha
(74) *Attorney, Agent, or Firm*—Synnestvedt & Lechner LLP

(57) ABSTRACT

A synchronization method and apparatus for detecting and synchronizing asynchronous signal data pulses. The synchronization system passes individual data pulses through two parallel synchronization sub-circuits, alternating synchronization sub-circuits for each succeeding pulse, and combines the output of the parallel synchronization sub-circuits to create a single synchronous signal.

17 Claims, 2 Drawing Sheets

US 6,738,442 B1

PULSE DETECTION AND SYNCHRONIZATION SYSTEM

FIELD OF THE INVENTION

The present invention relates to synchronous digital electronics. More particularly, the present invention relates to synchronizing an asynchronous signal to a local clock.

BACKGROUND OF THE INVENTION

Presently, many data systems transmit data using asynchronous transmission methods. In an asynchronous transmission system, data is sent at irregular intervals. These systems are commonly used to transmit data between computers, such as between individual computers and a mainframe. Often it is desirable to interface these asynchronous signals to synchronous systems. In order for a synchronous system to use an asynchronous signal, the asynchronous signal must be synchronized to the local clock of the synchronous system. Synchronization must be done to prevent metastability and timing exceptions from occurring in the circuitry of the synchronous system.

FIG. 2 depicts a prior art synchronization circuit 10 used to develop a synchronous output signal from an asynchronous input signal carrying data pulses. The prior art synchronization circuit 10 comprises two D-type flip-flops 16 and 18 connected in series, with each flip-flop 16 and 18 clocked by a synchronous clock 15 coupled to the clock inputs 16CK and 18CK. Flip-flops 16 and 18 are conventional falling-edge triggered and rising-edge triggered flip-flops, respectively. By using a falling-edge triggered flip-flop 16 followed by a rising-edge triggered flip-flop 16 (or vice versa), the signal delay introduced by the two flip-flops is one-half clock cycle compared to a full clock cycle delay if both flip-flops 16 and 18 were either rising-edge or falling-edge triggered flip-flops. The synchronization circuit 10 is capable of producing a synchronous output signal on line 14 from data pulses on the asynchronous input signal on line 12 as long as each pulse spans at least one falling edge of the synchronous clock 15 at the clock input 16CK of falling-edge triggered flip-flop 16. Thus, it is normally a condition for the proper operation of this circuit that the width of pulses on the input signal line 12 be greater than or equal to a clock cycle of clock 15. Asynchronous input signal line 12 data pulses will be lost if they are present at the flip-flop input 16D for a period of time which falls between falling edges of the synchronous clock signal 15.

FIG. 3 depicts a prior art synchronization circuit 20 which has improved signal detection capabilities. The prior art synchronization circuit 20 is created by connecting three D-type flip-flops 26, 28, and 30 in series. Synchronization circuit 20 is similar to the synchronization circuit 10 of FIG. 2 with the addition of flip-flop 30 and the use of the inverted output of flip-flop 28 to clear flip-flops 26 and 30. Flip-flop 30 is configured as a trigger to detect the occurrence of narrow pulse-width data pulses on asynchronous input signal line 22. The input 30D of flip-flop 30 is tied to a high value voltage 32 and the clock 30CK is tied to the asynchronous input signal line 22. This arrangement allows flip-flop 30 to capture narrow pulse-width data pulses by setting the output 30Q of flip-flop 30 high when the rising edge of a data pulse is impressed on the clock 30CK of flip-flop 30. However, this approach results in a circuit which requires a significant amount of recovery time before another data pulse can be detected. Between the time when the asynchronous input signal on line 22 transitions, triggering the first flip-flop 30, and the time when this flip-flop 30 is cleared and ready to accept a new pulse, all data pulses received in the interim will be missed.

The required recovery time can be as long as two and one-half clock cycles of the synchronization clock 25. A two and one-half clock cycle recovery time may occur in the following situation. If an incoming asynchronous clock signal data pulse on line 22 is impressed on the clock input 30CK of flip-flop 30, the output 30Q of flip-flop 30 will go high. The output 30Q of flip-flop 30 will remain high until flip-flop 30 is cleared by a clearing pulse from flip-flop 28 and flip-flop 30 will not be able to accept subsequent data pulses until the clearing pulse generated by flip-flop 28 is removed. The high signal on the output 30Q of flip-flop 30 will be impressed on the input 26D of flip-flop 26. As soon as a falling edge of synchronous clock 25 is impressed on flip-flop 26, the output of flip-flop 26 will go high. If a falling edge of synchronous clock 25 occurred just prior to receiving the data pulse, a one synchronization clock cycle delay will be introduced to a recovery period in synchronization circuit 20. The synchronization circuit 20 then experiences the addition of a one-half synchronization clock cycle delay to the recovery period between falling edge triggered flip-flop 26 and rising edge triggered flip-flop 28. Another synchronization clock cycle delay is added to the recovery period as the clear signal generated by flip-flop 28 clears flip-flop 26 and the low output of flip-flop 26 is propagated through flip-flop 28 to remove the clearing pulse generated at the inverted output 28QN of flip-flop 28. This requires a total of two and one-half synchronization clock cycles before another asynchronous signal data pulse may be received.

The prior art approaches to signal synchronization are not suitable for many applications. For example, if the data pulses of an asynchronous input signal are narrow or occur at a greater frequency than once every two and one-half clock cycles of the synchronous clock, the prior art approaches are unable to assure detection of all the pulses on the input signal.

SUMMARY OF THE INVENTION

The present invention discloses a synchronization method and apparatus capable of detecting and synchronizing asynchronous signal data pulses while minimizing the recovery time required after each data pulse. The invention accomplishes this by passing individual data pulses alternately through two parallel synchronization circuits and combining the output of the parallel synchronization circuits to create a single synchronous signal which is representative of the data pulses of the asynchronous signal.

DETAILED DESCRIPTION OF THE INVENTION

The present invention discloses an improved synchronization system for detecting individual pulses of an asynchronous data signal and synchronizing the individual pulses of the asynchronous data signal to a synchronous clock. The improved synchronization system comprises a pair of synchronization sub-circuits, a control circuit that controls the synchronization sub-circuits, and a combiner circuit that combines the outputs of the synchronization sub-circuits. The synchronization sub-circuits, controller, and combiner function together to generate a synchronous data output signal from an asynchronous data input signal.

Figure 1:
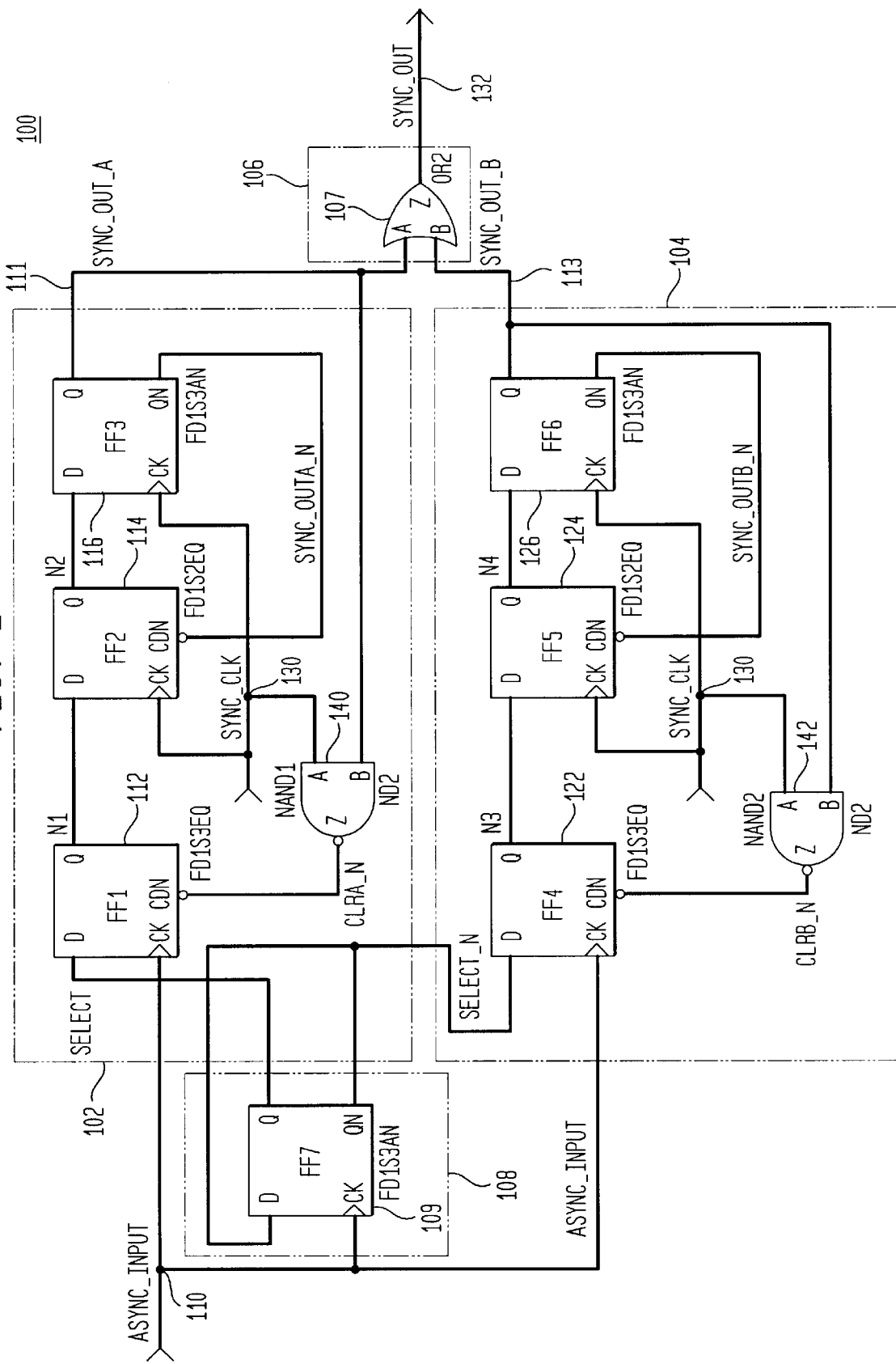
FIG. 1 is a block diagram of a synchronization circuit in accordance with the present invention.

FIG. 1 illustrates a preferred embodiment of a synchronization circuit 100, in accordance with the present invention. The synchronization circuit 100 comprises two synchronization sub-circuits 102 and 104, a selector 108, and a combiner 106. The synchronization circuit 100 synchronizes an asynchronous data signal on asynchronous input line 110 to a synchronous clock 130 to form a synchronous data signal on synchronous output line 132.

In the preferred embodiment, the asynchronous data signal on asynchronous input line 110 is coupled to synchronization sub-circuit 102, synchronization sub-circuit 104, and a selector 108. The selector 108, in the preferred embodiment, is a D-type flip-flop 109 having a rising-edge trigger which has an initial low value at its output 109Q. For descriptive purposes, a low value will be used synonymously with a logic "0" and a high value will be used synonymously with a logic "1." Also for descriptive purposes, it is assumed that all data pulses on the asynchronous data signal have a rising edge and that each pulse is separated by a null (low) period, however, data pulses where each data pulse has a falling edge could be used without departing from the spirit of the present invention.

The flip-flop 109 is configured as a trigger to capture short-duration, high, pulses in the asynchronous data signal on asynchronous input line 110. Also, input 109D is connected to the inverted output 109QN, and the asynchronous input line 110 is coupled to the clock 109CK of flip-flop 109. Initially the output 109Q of flip-flop 109 is low and the inverted output 109QN is high. Since inverted output 109QN is high, the input 109D is also high. When a transition from a low value to a high value occurs at input 109CK, indicating a pulse is being received on asynchronous input line 110, flip-flop 109 will set the output 109Q to high and the inverted output 109QN to low. In this arrangement each pulse received over asynchronous input line 110 toggles the output 109Q and the inverted output 109QN of flip-flop 109. As discussed in detail below, the output 109Q and inverted output 109QN are used to alternately select synchronization sub-circuit 102 and synchronization sub-circuit 104, respectively, for each pulse of the asynchronous data signal.

In the preferred embodiment, synchronization sub-circuit 102 comprises a series of three flip-flops 112, 114, and 116 and a NAND gate 140 which interface with the asynchronous data signal on asynchronous input line 110 and selector 108 to generate a synchronous output on line 111. Flip-flop 112 is a rising-edge triggered flip-flop which is configured to act as a trigger in order to capture high value pulses from the asynchronous data signal when flip-flop 109 selects synchronization sub-circuit 102 by impressing a high value on the input 112D of flip-flop 112. Flip-flop 112 is coupled to asynchronous input line 110 through its clock input 112CK and is coupled to flip-flop 109 through its data input 112D.

Flip-flops 114 and 116 are configured to generate a synchronous signal at line 111 from high value pulses captured by flip-flop 112. Flip-flop 114 is a falling-edge triggered flip-flop and flip-flop 116 is a rising-edge triggered flip flop. The clock input 114CK of flip-flop 114 and the clock input 116CK of flip-flop 116 are coupled to a synchronous clock 130. This arrangement reduces the delay for a pulse to propagate through the two flip-flops 112 and 114 to one-half of a clock cycle. The input 114D of flip-flop 114 is coupled to the output 112Q of flip-flop 112 in order to receive pulses captured by flip-flop 112. The value received at input 114D reaches output 114Q when synchronous clock 130 transitions from high to low. The input 116D of flip-flop 116 is coupled to receive the output 114Q of flip-flop 114, and the value received at input 116D reaches output 116Q when synchronous clock 130 transitions from low to high. The arrangement results in the generation of a synchronous signal on line 111 at the output 116Q of flip-flop 116 which is representative of the data pulses processed by synchronization sub-circuit 102.

The inverted output 116QN of flip-flop 116 is coupled to the clear input 114CDN of flip-flop 114. The non-inverted output 116Q of flip-flop 116 is coupled to the clear input 112CDN of flip-flop 112 through NAND gate 140 in which the output 116Q is NANDed with a clock signal from the synchronous clock 130. Both flip-flops 112 and 114 are cleared when a low value is received at their respective clear inputs 112CDN and 114CDN. Thus, when a high value is received at the input 116D of flip-flop 116, the inverted output 116QN is set to a low value after a rising edge of the synchronous clock 130 is received at the clock input 116CK of flip-flop 116. Flip-flop 114 is cleared by the low value at inverted output 116QN which produces a low value at output 114Q, and equivalently at input 116D. At the next rising-edge of the synchronous clock 130, a high value is set at output 116QN, thereby removing the clear signal from the clear input 114CDN. This loop requires a full clock cycle for flip-flops 114 and 116 to clear.

With respect to flip-flop 112, when a high value is output at output 116Q and the synchronous clock 130 has a high value, the output 140Z of NAND gate 140 will go low. This results in a low value at clear input 112CDN of flip-flop 112, thus clearing flip-flop 112 and causing the output 112Q to assume a low value. The low value on clear input 112CDN will be removed after one-half of a clock cycle when synchronization clock 130 transitions to a low value. Specifically, when synchronization clock 130 transitions to low, output 140Z of NAND gate 140 goes high, thereby removing the low value from 112CDN. After flip-flop 112 is cleared, flip-flop 112 will once again be able to detect asynchronous signal pulses on asynchronous input line 110 when synchronization sub-circuit 102 is selected by selector 108.

Figure 3:
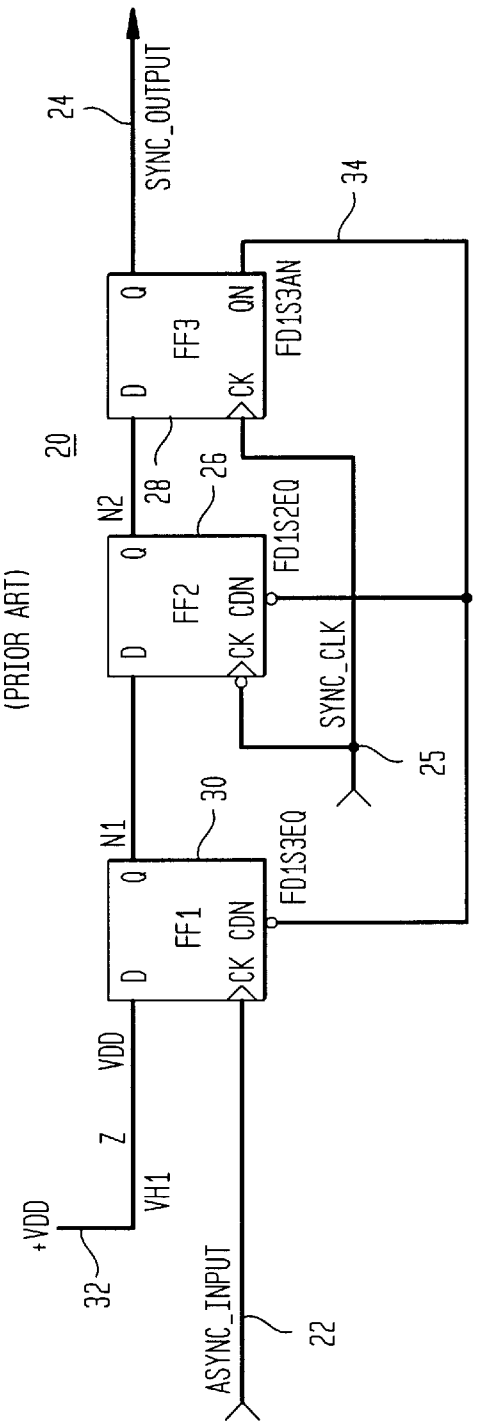
FIG. 3 is a block diagram of a prior art synchronization circuit capable of detecting narrow pulse-width data pulses.

By gating the synchronization clock 130 with the synchronous output on line 111 with a NAND gate to clear flip-flop 112, the worst case delay through the synchronization sub-circuit 102 is two clock cycles of the synchronization clock 130 as compared to the synchronization sub-circuit 20 in FIG. 3 which experiences a worst case delay of two and one-half clock cycles of the synchronization clock. Although synchronization sub-circuit 102 is used in the preferred embodiment of synchronization circuit 100, other synchronization circuits, such as synchronization circuit 20, could be used in accordance with the present invention to offer improvements over the prior art.

Synchronization sub-circuit 104 comprises a series of three flip-flops 122, 124, and 126 and a NAND gate 142 which interface with the asynchronous data signal on asynchronous input line 110 and selector 108 to generate a synchronous output on line 113. In the preferred embodiment, synchronization sub-circuits 102 and 104 are identical. However, in sub-circuit 104, data input 122D of flip-flop 122 is coupled to receive the inverted output 109QN, rather than the non-inverted output 109Q of flip-flop 109 in selection circuit 108. This arrangement allows synchronization sub-circuits 102 and 104 to alternately handle high value pulses received over input line 110, thereby allowing two pulses coming in quick succession over asynchronous input line 110 to be captured (one by sub-circuit 102 while sub-circuit 104 is being cleared and the next by sub-circuit 104 while sub-circuit 102 is being cleared).

Variations between the two synchronization sub-circuits 102 and 104 could be introduced without departing from the spirit of the present invention.

The synchronous signals on lines 111 and 113 generated by synchronization sub-circuits 102 and 104, respectively, are combined in combiner 106 to form a single synchronous signal on synchronous output line 132 which is representative of the asynchronous data signal received on asynchronous input line 110. In the preferred embodiment, combiner 106 is an OR gate 107 with an input 107A coupled to the synchronous signal on line 111 of synchronization sub-circuit 102, and an input 107B coupled to the synchronous signal on line 113 of synchronization sub-circuit 104 to produce the synchronous signal on synchronous output line 132 at output 107Z.

Figure 2:
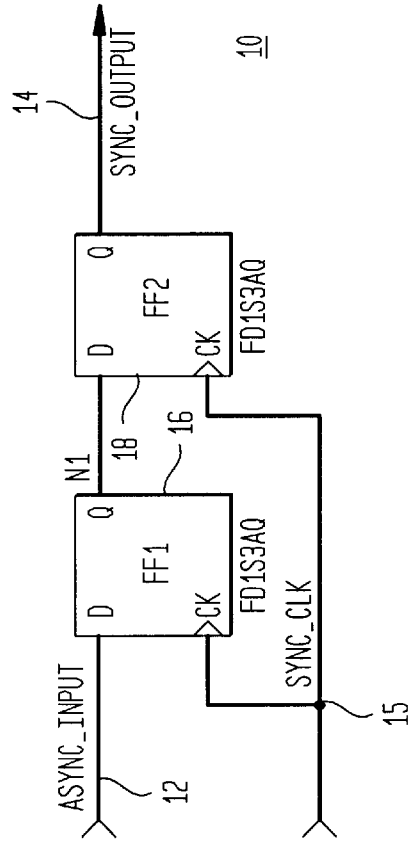
FIG. 2 is a block diagram of a prior art synchronization circuit.

In the present invention, the selector 108, the two synchronization sub-circuits 102 and 104, and the combiner 106 operate in conjunction with one another to detect pulses up to a maximum rate of one pulse per cycle of the synchronous clock 130. Synchronization sub-circuit 100 accomplishes this by alternately using synchronization sub-circuit 102 and synchronization sub-circuit 104 to synchronize pulses from the asynchronous data signal on asynchronous input line 110. Since, in the preferred embodiment, each synchronization sub-circuit 102 and 104 requires two clock cycles to recover after each pulse is received by a synchronization sub-circuit 102 or 104, the recovery time of synchronization circuit 100 is effectively reduced (capturing one pulse per clock cycle) by alternately using synchronization sub-circuit 102 and synchronization sub-circuit 104 to process the asynchronous data signal on asynchronous input line 110 and combining the synchronous signals on lines 111 and 113 of the two synchronization sub-circuits 102 and 104 with combiner 106. If synchronization circuits such as the synchronization circuit 20 of FIG. 3 are substituted for the synchronization sub-circuits 102 and 104, the recovery time of each synchronization sub-circuit 102 and 104 would be extended by one-half synchronization clock cycle, however, improvements over the prior art circuits depicted in FIGS. 2 and 3 would still result.

It will be readily apparent to those skilled in the art that many variations of the present invention could be configured without departing from the spirit of the present invention. For example, NAND gate 140 could be an AND gate followed by an inverter. Also, the circuit can readily be adapted to detect low value pulses instead of high value pulses and still be within the scope of the present invention. In addition, flip-flop 114 could be a rising-edge triggered flip-flop and flip-flop 116 could be falling-edge triggered flip-flop.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A circuit for interfacing an asynchronous signal with a synchronous system comprising:

a first synchronization circuit having a first input coupled to receive an asynchronous signal comprising data pulses, and a second input coupled to a clock, said first synchronization circuit comprising at least a first flip-flop having a clear input, wherein said first synchronization circuit is arranged to generate a first output signal in which said input data pulses are synchronized to said clock and wherein said first output signal is gated to said clock to provide a first gated output signal and wherein said first gated output signal is coupled to said clear input of said first flip-flop;

a second synchronization circuit having a third input coupled to receive said asynchronous signal comprising data pulses, and a fourth input coupled to said clock, said second synchronization circuit comprising at least a second flip-flop having a clear input, wherein said second synchronization circuit is arranged to generate a second output signal in which said input data pulses are synchronized to said clock and wherein said second output signal is gated to said clock to produce a gated output signal and wherein said gated output signal is coupled to said clear input of said second flip-flop;

a selector circuit having a selector input coupled to said asynchronous signal and a selector output coupled to said first and second synchronization circuits, said selector circuit alternately selecting said first and second synchronization circuits to synchronize said data pulses; and a combiner circuit coupled to receive said first output signal of said first synchronization circuit and said second output signal of said second synchronization circuit to produce a combined output signal comprising said data pulses from said first and second synchronization circuits.

2. A synchronization circuit for interfacing an asynchronous signal with a synchronous system comprising:

a first synchronization sub-circuit having a first input coupled to an asynchronous signal comprising individual data pulses, a second input, and a first output outputting a first output signal, said first synchronization sub-circuit operably coupled to a clock, wherein said first synchronization sub-circuit comprises at least a first flip-flop having a clear input, and wherein said first output signal is gated to said clock to provide a first gated output signal and wherein said first gated output signal is coupled to said clear input of said first flip-flop;

a second synchronization sub-circuit having a third input coupled to said asynchronous signal, a fourth input, and a second output outputting a second output signal, said second synchronization sub-circuit operably coupled to said clock, wherein said second synchronization sub-circuit comprises at least a second flip-flop having a clear input, and wherein said second output signal is gated to said clock to produce a second gated output signal and wherein said second gated output signal is coupled to said clear input of said second flip-flop;

a selector having a selector input for coupling to said asynchronous signal, a first selector output coupled to the second input of said first synchronization sub-circuit, and a second selector output coupled to the fourth input of said second synchronization sub-circuit, said selector detecting said individual data pulses of said asynchronous signal and passing said individual data pulses alternately to said first and second synchronization sub-circuits for processing; and a combiner having a first combiner input coupled to the first output of said first synchronization sub-circuit, a second combiner input coupled to the second output of said second synchronization sub-circuit, and a combiner output, said combiner combining said individual data pulses after processing by said first and second synchronization sub-circuits to generate a synchronous signal at the said combiner output, such that said synchronous signal is representative of said individual data pulses of said asynchronous signal.

3. The synchronization circuit of claim 2, wherein said selector comprises a selector flip-flop having a clock input for coupling to said asynchronous signal, a non-inverted first selector output coupled to the second input of said first synchronization sub-circuit, an inverted second selector output coupled to the fourth input of said second synchronization sub-circuit, and a selector input coupled to the inverted output of said selector flip-flop, such that said selector flip-flop detects said individual data pulses of said asynchronous signal and alternately selects said first and second synchronization sub-circuits to process said individual data pulses.

4. The synchronization circuit of claim 3, wherein each of said first and second synchronization sub-circuits comprises:
a first supplementary flip-flop having an output, a low clear input, a rising-edge clock input coupled to said asynchronous signal, and a data input coupled to said selector flip-flop of said selector circuit, wherein the data input of said first supplementary flip-flop of said first synchronization sub-circuit is coupled to the output of said selector flip-flop and the data input of said second flip-flop of said second synchronization sub-circuit is coupled to the inverted output of said selector flip-flop;
a second supplementary flip-flop having an output, a low clear input, a data input coupled to the output of said second flip-flop, and a falling-edge clock input operably coupled to said clock;
a third supplementary flip-flop having a non-inverted output, an inverted output coupled to the low clear input of said third flip-flop, a data input coupled to the output of said third flip-flop, and a rising-edge clock input operably coupled to said clock; and
a NAND gate having a first input for coupling to said clock, a second input coupled to the output of said third supplementary flip-flop, and an output coupled to the low clear input of the first supplementary flip-flop.

5. The synchronization circuit of claim 4, wherein said combiner is an OR gate.

6. The synchronization circuit of claim 5, wherein all flip-flops are D-type flip-flops.

7. The synchronization circuit of claim 3, wherein each of said first and second synchronization sub-circuits comprises:
a first supplementary flip-flop having an output, a clear input, a clock input coupled to said asynchronous signal, and a data input coupled to said first flip-flop of said selector circuit, wherein the data input of said first supplementary flip-flop of said first synchronization sub-circuit is coupled to the output of said selector flip-flop of said selector circuit and the data input of said first supplementary flip-flop of said second synchronization sub-circuit is coupled to the inverted output of said selector flip-flop;

a second supplementary flip-flop having an output, a clear input, a data input coupled to the output of said first supplementary flip-flop, and a clock input operably coupled to said clock;
a third supplementary flip-flop having a non-inverted output, an inverted output coupled to the clear input of said second supplementary flip-flop, a data input coupled to the output of said second supplementary flip-flop, and a clock input operably coupled to said clock; and
a NAND gate having a first input for coupling to said clock, a second input coupled to the output of said third supplementary flip-flop, and an output coupled to the clear input of said first supplementary flip-flop.

8. The synchronization circuit of claim 7, wherein:
said second supplementary flip-flop is a falling-edge triggered flip-flop;
said third supplementary flip-flop is a rising-edge triggered flip-flop; and
said first supplementary and said second supplementary flip-flops clear on a low value.

9. The synchronization circuit of claim 8, wherein all flip-flops are D-type flip flops.

10. An integrated circuit comprising:
first and second synchronization circuits, each of said first and second synchronization circuits comprising;
a first flip-flop having an output, a low clear input, a rising-edge clock input coupled to an asynchronous signal comprising individual data pulses, and a data input,
a second flip-flop having an output, a low clear input, a data input coupled to the output of said first flip-flop, and a falling-edge clock input operably coupled to a clock,
a third flip-flop having a non-inverted output, an inverted output coupled to the low clear input of said second flip-flop, a data input coupled to the output of said second flip-flop, and a rising-edge clock input operably coupled to said clock, and
a NAND gate having a first input for coupling to said clock, a second input coupled to the output of said third flip-flop, and an output coupled to the low clear input of said first flip-flop;
a fourth flip-flop having a clock input for coupling to said asynchronous signal, a non-inverted output coupled to the data input of said first flip-flop of said first synchronization circuit, an inverted output coupled to the data input of said first flip-flop of said second synchronization circuit, and a data input coupled to the inverted output of said fourth flip-flop, such that said fourth flip-flop detects said individual data pulses of said asynchronous signal and alternately selects said first and second synchronization circuits to process said individual data pulses; and
an OR gate having a first input coupled to said first synchronization circuit, a second input coupled to said second synchronization circuit, and an output, wherein a synchronous signal representative of the individual data pulses of said asynchronous signal is generated at the output of said OR gate.

11. A method for synchronizing an asynchronous signal to a local clock comprising the steps of:
passing an asynchronous signal comprising a plurality of data pulses to a selector, a first synchronization circuit, and a second synchronization circuit;
alternately selecting said first synchronization circuit and said second synchronization circuit for each of said plurality of pulses with said selector;

synchronizing alternate ones of said plurality of pulses with said first and second synchronization circuits;

clearing said first synchronization circuit after each data pulse synchronized by said first synchronization circuit;

clearing said second synchronization circuit after each data pulse synchronized by said second synchronization circuit; and combining said plurality of synchronized pulses from said first and second synchronization circuits, such that a synchronous signal representative of said plurality of data pulses is generated.

12. A method for synchronizing an asynchronous signal to a local clock comprising the steps of:

passing an asynchronous signal having a first asynchronous pulse and a second asynchronous pulse to a first synchronization circuit, a second synchronization circuit, and a selector;

selecting said first synchronization circuit to synchronize said first asynchronous pulse, and said second synchronization circuit to synchronize said second asynchronous pulse;

synchronizing said first and second asynchronous pulses with said first and second synchronization circuits to derive first and second synchronous pulses, respectively;

clearing said first synchronization circuit after synchronizing said first asynchronous pulse; and clearing said second synchronization circuit after synchronizing said second synchronous pulse; and combining said first and second synchronous pulses to form a single synchronous signal representative of said asynchronous signal.

13. A method for synchronizing an asynchronous signal to a local clock comprising the steps of:

receiving an asynchronous input signal having a plurality of data pulses at a selector, a first synchronization circuit, and a second synchronization circuit;

detecting each of said plurality of data pulses with said selector;

alternately selecting said first synchronization circuit and said second synchronization circuit to process succeeding data pulses of said plurality of data pulses, such that said first synchronization circuit processes every other data pulse and said second synchronization circuit processes the data pulses between the data pulses processed by said first synchronization circuit;

synchronizing alternate ones of said plurality of data pulses in said first and second synchronization circuits;

clearing said first synchronization circuit after each data pulse synchronized by said first synchronization circuit; and clearing said second synchronization circuit after each data pulse synchronized by said second synchronization circuit; and combining said plurality of data pulses after synchronizing, such that a single synchronous data signal is created which is representative of said plurality of data pulses on said asynchronous input signal.

14. The method of claim 13, wherein said step of combining comprises ORing together data pulses processed by said first synchronization circuit and data pulses processed by said second synchronization circuit.

15. The method of claim 13, wherein said step of alternately selecting comprises toggling a flip-flop with consecutive data pulses.

16. The method of claim 13, wherein said step of detecting is performed by a flip-flop configured as a trigger.

17. The method of claim 13, wherein said step of clearing said first synchronization circuit comprises clearing a flip-flop with a clock NANDed with an output of said first synchronization circuit, and said step of clearing said second synchronization circuit comprises clearing a flip-flop with said clock NANDed with an output of said second synchronization circuit.

* * * * *